VARIABLE ATTENUATOR

Filed May 3, 1965

INVENTOR.
RICHARD W. HULL

BY John L. Rawler
ATTORNEY

United States Patent Office 3,412,348

Patented Nov. 19, 1968

3,412,348

VARIABLE ATTENUATOR

Richard W. Hull, Sunnyvale, Calif., assignor to Sylvania Electric Products Inc., a corporation of Delaware Filed May 3, 1965, Ser. No. 452,793

3 Claims. (Cl. 333—8)

ABSTRACT OF THE DISCLOSURE

A network having a constant input impedance $Z_0$ for attenuating an input signal having a predetermined frequency. The network includes the series combination of a first tunable shunt resonant circuit, an inductor and a first load having an impedance $Z_0$ connected between an input terminal and ground. The output of the network is coupled from the first load. A by-pass circuit including a second tunable shunt resonant circuit, a capacitor and a second load having an impedance $Z_0$ is also connected in series between the input terminal and ground. The attenuation of the network is changed by varying the resonant frequencies of the resonant circuits.

Figures 1, 2, 3:
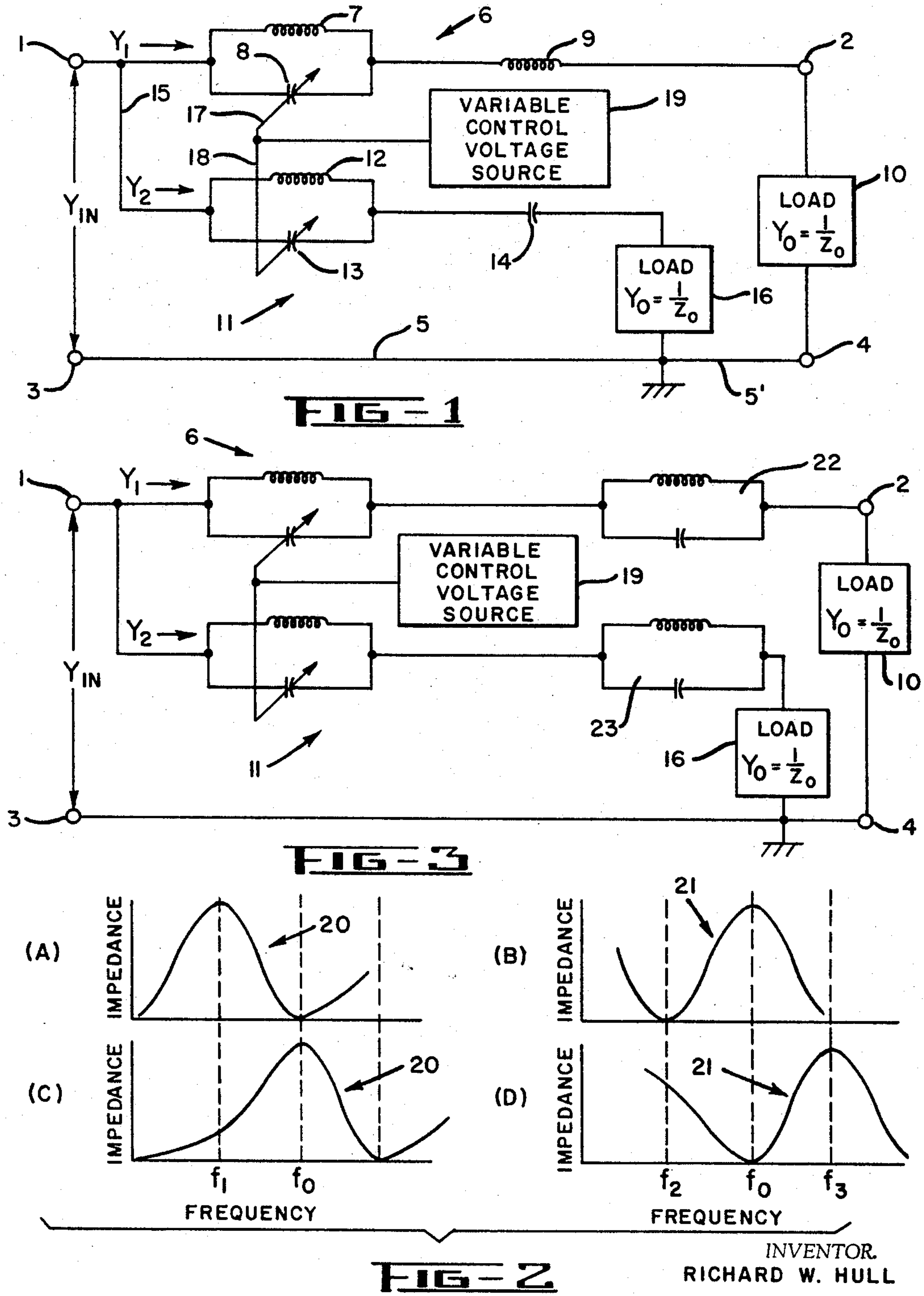

This invention relates to attenuators and more particularly to a remotely controlled variable attenuator having a constant input impedance.

It is desirable that receivers have means for automatically controlling signal level to prevent very strong signals and interfering signals from saturating any stage of the receiver. The automatic gain control (AGC) circuit, which utilizes the feedback principle to correct signal level change, is a common method of accomplishing this function. In certain applications, such as in a parametric up-converter receiver employing a crystal filter having sharp skirt selectivity, it may be desirable to control signal level at the output of the crystal filter. It is important in such applications that the circuit or load connected to the output of the crystal filter have a constant input impedance so that the circui does not load the crystal filter and cause a ripple to be generated in the output thereof. AGC circuits having constant input impedance presently are neither attractive nor readily available for operating at frequencies greater than about 100 m.c.p.s. Alternatively, signal level may be controlled by attenuation of the signal. Since the magnitude of a received signal may vary rapidly, it is desirable that the attenuation be continuously variable and automatically controllable. Presently available externally controlled attenuators, such as those employing transistors and diode switching techniques, either do not have input impedances that are sufficiently constant to be useful in the above application or are not continuously variable.

An object of this invention is the provision of an automatic signal level control for signals having frequencies greater than 100 m.c.p.s.

Another object is the provision of a variable attenuator providing continuously variable attenuation at a constant input impedance.

Another object is the provision of a variable attenuator having a constant input impedance that is adaptable to remote electrical control by a single control signal.

Another object is the provision of a variable attenuator having a constant input impedance that is simple and economical to construct.

The foregoing objects are accomplished by a network comprising a first tunable resonant circuit connected between an input and an output terminal. A second tunable resonant circuit in series with a load having a predetermined impedance is connected between the input terminal and a reference potential. The attenuation of the network is controlled by varying the resonant frequencies of the resonant circuits. In order to pass the input signal to the output terminal without attenuation, the resonant frequencies of the first and second resonant circuits are simultaneously adjusted so that the circuits have minimum and maximum impedances, respectively, at the frequency of the input signal. Maximum attenuation of the input signal is provided by simultaneous adjustment of the resonant frequencies of the first and second resonant ciriuts to present maximum and minimum impedances, respectively, at the frequency of the input signal to bypass to the load the input signal applied to the input terminal. When the output of the network is terminated in a load having the predetermined impedance and elements of the resonant circuits are properly selected, the input impedance of the network is a constant, is equal to the predetermined impedance and is independent of the impedances of the resonant circuits.

This invention and these and other objects thereof will be more fully understood from the following description of a preferred embodiment thereof, reference being had to the accompanying drawings in which:

FIGURE 1 is a schematic diagram of an attenuator network embodying this invention;

FIGURES 2A to 2D, inclusive, are resonance curves illustrating the operation of the attenuator of FIGURE 1; and FIGURE 3 is a schematic diagram of a modified form of the attenuator of FIGURE 1.

Referring to FIGURE 1, the network representing a preferred embodiment of the invention comprises a signal path between input terminal 1 and output terminal 2 in combination with a bypass circuit between input terminal 1 and a reference potential which may be ground as shown in the drawings. A second input terminal 3 and an output terminal 4 are connected through lines 5 and 5' to the reference potential. The signal path comprises a tunable resonant circuit or series circuit 6 including the parallel combination of inductor 7 and varactor diode or variable capacitor 8 connected in series with inductor 9. Output terminals 2 and 4 are terminated by a load 10 having a predetermined impedance. The predetermined impedance may be equal to or proportional to the input impedance of the next stage or the output impedance of the preceding stage.

The bypass circuit includes a tunable resonant circuit or parallel or shunt circuit 11 comprising the parallel combination of inductor 12 and varactor diode or variable capacitor 13 connected in series with capacitor 14 and connected through line 15 to input terminal 1. The bypass circuit is connected to the reference potential through load 16. The impedance of load 16 is also equal to the predetermined impedance. The capacitances and impedances of varactor diodes 8 and 13 are varied by control voltages on lines 17 and 18, respectively, from variable control voltage source 19.

In operation, an input signal having a frequency substantially equal to a frequency $f_0$ is applied between input terminals 1 and 3. When it is desired to pass the input signal without attenuation, the control signal on line 17 is adjusted to bias varactor diode 8 so that the parallel combination of inductor 7 and diode 8 is resonant at a frequency $f_1$ (see FIGURE 2A) less than the signal frequency $f_0$ to provide a large impedance at the frequency $f_1$. Inductor 7 and diode 8 are also resonant with inductor 9 at the signal frequency $f_0$ (see FIGURE 2A) to provide a minimum impedance or short circuit in the signal path to a signal having a frequency $f_0$. At the same time, the control voltage on line 18 biases varactor diode 13 so that the parallel combination of inductor 12 and diode 13 is resonant at the signal frequency $f_0$ (see FIGURE 2B) to provide a maximum impedance or open circuit in the bypass circuit to a signal having a frequency $f_0$. Inductor 12 and diode 13 are also resonant with capacitor 14 at frequency $f_2$ less than the signal frequency $f_0$ (see FIGURE 2B) to provide a minimum impedance at the frequency $f_2$. The frequencies $f_1$ and $f_2$ may be equal. The bypass circuit is therefore a high impedance path to an input signal having a frequency $f_0$, whereas the signal path is a low impedance path to this input signal. Thus, the input signal is blocked from the bypass circuit and there is therefore substantially zero attenuation thereof in passing between input terminal 1 and output terminal 2.

When it is desired to provide maximum attenuation of the input signal, the control voltages on lines 17 and 18 are adjusted to vary the resonant frequencies and impedances of the associated tunable resonant circuits 6 and 11, respectively. The control voltage on line 17 is adjusted to bias varactor diode 8 so that the parallel combination of inductor 7 and diode 8 is now resonant at the signal frequency $f_0$ (see FIGURE 2C) to provide a maximum impedance in the signal path to a signal having a frequency $f_0$. The resonant frequency of inductors 7 and 9 and diode 8 is also increased to provide a minimum impedance in the signal path at a frequency greater than the signal frequency $f_0$ (see FIGURE 2C). At the same time, the control voltage on line 18 biases varactor diode 13 so that the resonant frequency of inductor 12, diode 13 and capacitor 14 is increased (see FIGURE 2D) to provide a minimum impedance in the bypass circuit at the signal frequency. The resonant frequency of inductor 12 and diode 13 is also increased to provide a large impedance in the bypass circuit at a frequency $f_3$ greater than the signal frequency $f_0$ (see FIGURE 2D). Thus, line 15 is a low impedance path to the input signal. The input signal is therefore bypassed through line 15 and dissipated in load 16 to provide maximum attenuation of the input signal.

Attenuation of the input signal between these minimum and maximum values (varying the portion of the input signal bypassed to load 16) is controlled by varying the capacitance of varactor diode 8 to vary the resonant frequency of series circuit 6 determined by inductor 7 and diode 8 between the frequencies $f_1$ and $f_0$ (see FIGURES 2A and 2C) and simultaneously varying the capacitance of varactor diode 13 to vary the resonant frequency of shunt circuit 11 determined by inductor 12 and diode 13 between the frequencies $f_0$ and $f_3$ (see FIGURES 2B and 2D). The desired minimum or zero impedances at the signal frequency $f_0$ in the signal path and the bypass circuit (see FIGURES 2A and 2D, respectively) are obtained by employing inductor 9 and capacitor 14, respectively, in the associated resonant circuits. Circuits 6 and 11 are designed so that the rate of change of the slope of the normalized impedances thereof (see portions 20 and 21 of the waveforms of FIGURES 2A to 2D, inclusive) are equal, but are of opposite phase (i.e., as the magnitude of one increases the magnitude of the other decreases) in response to an equal change in the capacitance of varactor diodes 8 and 13, respectively. Under such conditions, the input impedance between input terminals 1 and 2 is a constant equal to the predetermined impedance and independent of the impedances of varactor diodes 8 and 13 as is shown mathematically hereinafter.

The modified form of the invention illustrated in FIGURE 3 differs from the attenuator of FIGURE 1 in that inductor 9 and capacitor 14 are replaced by tuned circuits 22 and 23, respectively. The circuit of FIGURE 3 is useful in applications wherein the required reactances of inductor 9 or capacitor 14 are not readily realizable from single components.

The constant value of the input impedance between input terminals 1 and 3 of the network of FIGURE 1 over changes in the attenuation of the network and the impedance of varactor diodes 8 and 13 is verified by following analysis of the input admittance (the reciprocal of the input impedance) of the network. The input admittance $Y_{in}$ between input terminals 1 and 3 is $$Y_{in}=Y_1+Y_2 \tag{1}$$

where $Y_1$ is the admittance of the signal path including series circuit 6 and load 10, and $Y_2$ is the admittance of the bypass circuit.

The admittance $Y_1$ is $$Y_1=\frac{1}{R+j\omega_0L_3+\frac{j\omega_0L_1}{1-\omega_0^2L_1C_1}}=\frac{1}{R+j\omega_0L_3+\frac{j\omega_0L_1}{1-ax}} \tag{2}$$

where R is the impedance of load 10, $\omega_0=2\pi f_0$ is the radian frequency of the input signal, $L_3$ is the inductance of inductor 9, $L_1$ is the inductance of inductor 7, $C_1=xC_{10}$ is a fraction $x$ of the maximum capacitance $C_{10}$ of varactor diode 8

$$a=\frac{\omega_0^2}{\omega_1^2},\text{ and }\omega_1^2=\frac{1}{L_1C_{10}}$$

is the square of the radian resonant frequency of inductor 7 and diode 8 of series circuit 6 for $x=1$ for providing a pole of impedance of a frequency $f_1$ less than the signal frequency $f_0$.

Since the input impedance of the network is to be a constant equal to the predetermined impedance R, the admittance $Y_1$ for minimum attenuation of an input signal of frequency $f_0$ is $$Y_1=\frac{1}{R} \tag{3}$$

for $C_1=C_{10}$, $x=1$, or alternatively $$j\omega_0L_3=\frac{j\omega_0L_1}{a-1} \tag{4}$$

Substituting this information into Equation 2, the admittance $Y_1$ is $$Y_1=\frac{1}{R+j\omega_0L_1\left(\frac{a}{a-1}\right)\left(\frac{1-x}{1-ax}\right)} \tag{5}$$

where $$1\geq x\geq\frac{1}{a}$$

since $$Y_1=\frac{1}{R}\text{ for }x=1$$

(condition for series circuit 6 to be resonant at the signal frequency $f_0$ to provide zero attenuation of an input signal) and $$Y_1=0\text{ for }x=\frac{1}{a}$$

(condition for inductor 7 and diode 8 of series circuit 6 to be resonant at the signal frequency $f_0$ for providing maximum attenuation of an input signal).

Similarly, the input admittance $Y_2$ of the bypass circuit is $$Y_2=\frac{1}{R+\frac{1}{j\omega_0C_3}+\frac{j\omega_0L_2}{1-\omega_0^2L_2C_2}}=\frac{1}{R+\frac{1}{j\omega_0C_3}+\frac{j\omega_0L_2}{1-x}} \tag{6}$$

where $C_3$ is the capacitance of capacitor 14, $L_2$ is the inductance of inductor 12, $C_2=xC_{20}$ is a fraction $x$ of the maximum capacitance $C_{20}$ of varactor diode 13

$$\omega_0^2=\frac{1}{L_2C_{20}}$$

is the square of the radian resonant frequency of inductor 12 and diode 13 of shunt circuit 11 for $x=1$ for providing a pole of impedance at the signal frequency $f_0$, $$a=\frac{\omega_2^2}{\omega_0^2},\text{ and }\omega_2^2=\frac{a}{L_2C_{20}}$$

is the square of the radian resonant frequency of shunt circuit 11 for $$x=\frac{1}{a}$$

for providing a zero of impedance at the signal frequency $f_0$. Since the input impedance of the network is to be a constant equal to the predetermined impedance R, the admittance $Y_2$ of the bypass circuit for maximum attenuation of an input signal of frequency $f_0$ for passing the input signal through the bypass circuit is $$Y_2=\frac{1}{R} \qquad (7)$$

for $C_2=xC_{20}$, $$x=\frac{1}{a}$$

or alternatively $$\frac{1}{j\omega_0C_3}=j\omega_0L_2\left(\frac{a}{1-a}\right) \qquad (8)$$

Substituting this information into Equation 6, the admittance $Y_2$ is $$Y_2=\frac{1}{R+j\omega_0L_2\left(\frac{1}{1-a}\right)\left(\frac{1-ax}{1-x}\right)} \qquad (9)$$

Substituting Equations 5 and 9 in Equation 1, the input admittance $Y_{in}$ of the network is $$Y_{in}=Y_1+Y_2$$

$$=\frac{1}{R}\left[\frac{1}{1+\frac{j\omega_0L_1}{R}\left(\frac{a}{a-1}\right)\left(\frac{1-x}{1-ax}\right)}+\frac{1}{1+\frac{j\omega_0L_2}{R}\left(\frac{1}{1-a}\right)\left(\frac{1-ax}{1-x}\right)}\right]$$

$$=\frac{1}{R}\left[\frac{1}{1+A}+\frac{1}{1+B}\right] \qquad (10)$$

Since the input impedance of the network is to be a constant equal to the predetermined impedance R, the sum of the terms in the brackets of Equation 10 must equal unity for the input admittance $Y_{in}$ to be equivalent to $1/R$. Rearranging the terms in the brackets in Equation 10 and equating to unity, $$\frac{\omega_0^2L_1L_2}{R^2}\left(\frac{a}{(a-1)^2}\right)=\frac{1}{R^2\omega_0^2C_{10}C_{20}}\left(\frac{a}{(a-1)^2}\right)=1 \qquad (11)$$

Analysis of Equation 11 reveals that all terms therein are constant. Thus, if values of the elements of Equation 11 are properly selected, the input admittance $Y_{in}$ is independent of the variable $x$ and of change in the attenuation of the network.

Since it is not necessary that the maximum capacitances $C_{10}$ and $C_{20}$ of varactor diodes 8 and 13, respectively, be equal, let $$C_{10}=b^2C_{20} \qquad (12)$$

where $b$ is a constant. It is necessary, however, that the capacitance of varactor diodes 8 and 13 vary simultaneously and at the same rate, i.e., $dC/dt$ is the same for both diodes. Substituting Equation 12 in Equation 11, $$R\omega_0C_{20}b=\frac{a}{a-1} \qquad (13)$$

where R is the predetermined impedance, $\omega_0=2\pi f_0$ is the radian frequency of the input signal, $C_{20}$ is the maximum capacitance of varactor diode 13, $b$ is a constant relating the maximum capacitances $C_{10}$ and $C_{20}$ of varactor diodes 8 and 13, respectively, and $$a=\frac{\omega_0^2}{\omega_1^2}=\frac{\omega_2^2}{\omega_0^2}$$

Thus, by selecting elements to satisfy the above relationships, the sum of the terms in the brackets of Equation 10 is unity and the input impedance of the network is a constant equal to the reference impedance.

By way of example, the variable attenuator shown in FIGURE 1 was built and tested and had the following components and operation:

| | | |
|---|---|---|
| Inductor **7** | μh | 0.175 |
| Inductor **9** | μh | 0.070 |
| Inductor **12** | μh | 0.051 |
| Varactor diodes **8** and **13** | | PC116 |
| Capacitances ($C_{10}=C_{20}$) | p.f.d. | 22 |
| Capacitor **14** | p.f.d. | 28.4 |
| Load (resistor) **10** | ohms | 50 |
| Load (resistor) **16** | do | 50 |
| Control voltage | v | 1.5–20 |
| Design frequency $f_0$ | m.c.p.s. | 112 |
| Bandwith | mc | 7 |
| Attenuation: | | |
| Minimum | db | 1 |
| Maximum | db | 59 |
| Input impedance variance (over range of attenuation) | percent | 10 |

Although this invention is described in relation to a preferred embodiment thereof, variations and modifications will be apparent to those skilled in the art. The scope and breadth of this invention is, therefore, to be determined from the following claims rather than from the above detailed description of a preferred embodiment thereof.

What is claimed is:

1. A variable attenuator having a substantially constant input impedance equal to a predetermined impedance for attenuating an input signal having a predetermined frequency, said attenuator comprising a first tunable resonant circuit resonant at the predetermined frequency for providing a maximum impedance at the predetermined frequency, comprising a second tunable resonant circuit having first and second terminals, and a third reactive circuit having a first terminal connected to the second terminal of said second circuit and having a second terminal, a fourth tunable resonant circuit resonant at a frequency other than the predetermined frequency for providing a low impedance at the predetermined frequency, comprising a fifth tunable resonant circuit having a first terminal connected to the first terminal of said second circuit and having a second terminal, and a sixth reactive circuit having a first terminal connected to the second terminal of said fifth circuit and having a second terminal, a first load connected between the second terminal of said third circuit and a reference potential, the impedance of said first load being equal to the predetermined impedance, a second load connected between the second terminal of said sixth circuit and the reference potential for terminating the attenuator in the predetermined impedance, means for applying an input signal to the first terminal of said first circuit, and means for simultaneously varying the resonant frequencies of said tunable resonant circuits for varying the attenuation of the input signal.

2. A variable attenuator having a substantially constant input impedance equal to a predetermined impedance for attenuating an input signal having a predetermined frequency, said attenuator comprising a first tunable resonant circuit having a resonant frequency for providing a maximum impedance at a frequency different from the predetermined frequency, comprising a first inductor element having first and second terminals, a first capacitor element connected in parallel with said first inductor, and a third reactive element having a first terminal connected to the second terminal of said first inductor and having a second terminal, a second tunable resonant circuit having a resonant frequency whereby to provide a maximum impedance at the predetermined frequency, comprising a second inductor element having a first terminal connected to the first terminal of said first inductor and having a second terminal, a second capacitor element connected in parallel with said second inductor, and a sixth reactive element having a first terminal connected to the second terminal of said second inductor and having a second terminal, a load having a first terminal connected to the second terminal of said sixth element and having a second terminal connected to a reference potential, the impedance of said load being equal to the predetermined impedance, means connected between the second terminal of said third element and the reference potential for terminating the attenuator in the predetermined impedance, means for applying an input signal to the first terminal of said first inductor, and means for simultaneously varying the impedances of one of said shunt elements of each of said tunable resonant circuits whereby to vary the impedances of said tunable resonant circuits at the same rate and in opposite directions to vary the attenuation of the input signal.

3. A variable attenuator having a substantially constant input impedance equal to a predetermined impedance for attenuating an input signal having a predetermined frequency, said attenuator comprising a first tunable resonant circuit having a first resonant frequency providing a maximum impedance at a frequency different from the predetermined frequency and having a second resonant frequency providing a minimum impedance at the predetermined frequency, comprising a first inductor having first and second terminals, a first varactor diode connected in parallel with said first inductor.

a second inductor having a first terminal connected to the second terminal of said first inductor and having a second terminal, a second tunable resonant circuit having a first resonant frequency providing a minimum impedance at a frequency different from the predetermined frequency and having a second resonant frequency providing a maximum impedance at the predetermined frequency, comprising a third inductor having a first terminal connected to the first terminal of said first inductor and having a second terminal, a second varactor diode connected in parallel with said third inductor said varactor diodes having substantially identical voltage response characteristics, and a capacitor having a first terminal connected to the second terminal of said third inductor and having a second terminal, a first load connected between the second terminal of said capacitor and a reference potential, the impedance of said first load being equal to the predetermined impedance, a second load connected between the second terminal of said second inductor and the reference potential for terminating the attenuator in the predetermined impedance, means for applying the input signal to the first terminal of said first inductor, a control source for generating a variable DC control voltage, and means for simultaneously applying the control voltage to said first and second varactor diodes for simultaneously providing equal variation of the impedances thereof at the same rate whereby to vary the resonant frequencies of said resonant circuits to vary the impedances thereof at the same rate and in opposite directions for varying the attenuation of the input signal.

References Cited

UNITED STATES PATENTS

| | | | |
|---|---|---|---|
| 2,258,974 | 10/1941 | Dagnall | 333—8 X |
| 2,270,416 | 1/1942 | Cork et al. | 333—8 X |
| 2,762,017 | 9/1956 | Bradburd et al. | 333—9 |
| 2,861,245 | 11/1958 | Krause | 333—9 |
| 2,138,996 | 12/1938 | Blumlein | 333—76 |
| 3,049,667 | 8/1962 | Broadhead et al. | 324—81 X |
| 3,110,004 | 11/1963 | Pope | 334—15 |
| 3,188,566 | 6/1965 | Bullene | 333—6 X |
| 3,217,275 | 11/1965 | Duncan et al. | 333—6 X |

FOREIGN PATENTS 817,962 8/1959 Great Britain.

HERMAN KARL SAALBACH, *Primary Examiner.*

W. H. PUNTER, *Assistant Examiner.*